(12) United States Patent
Kanakasabapathy et al.

(10) Patent No.: US 7,820,552 B2
(45) Date of Patent: Oct. 26, 2010

(54) ADVANCED HIGH-K GATE STACK PATTERNING AND STRUCTURE CONTAINING A PATTERNED HIGH-K GATE STACK

(75) Inventors: Siva Kanakasabapathy, Hopewell Junction, NY (US); Ying Zhang, Yorktown Heights, NY (US); Edmund M. Sikorski, Florida, NY (US); Hongwen Yan, Somers, NY (US); Vijay Narayanan, New York, NY (US); Vamsi K. Paruchuri, New York, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 11/685,558

(22) Filed: Mar. 13, 2007

(65) Prior Publication Data

US 2008/0224238 A1 Sep. 18, 2008

(51) Int. Cl.
*H01L 21/302* (2006.01)
(52) U.S. Cl. ............... 438/704; 438/689; 257/E21.214; 257/E29.226
(58) Field of Classification Search ............... 438/704, 438/689; 257/E21.214, E29.226
See application file for complete search history.

(56) References Cited

U.S. PATENT DOCUMENTS

| 6,893,927 | B1 * | 5/2005 | Shah et al. ................. 438/287 |
| 7,037,849 | B2 * | 5/2006 | Chiu et al. ................. 438/725 |
| 7,138,323 | B2 | 11/2006 | Kavalieros et al. |
| 2006/0115972 | A1 * | 6/2006 | Rotondaro et al. .......... 438/592 |
| 2006/0121678 | A1 * | 6/2006 | Brask et al. ................. 438/287 |
| 2006/0166457 | A1 | 7/2006 | Liu et al. |
| 2006/0183277 | A1 | 8/2006 | Brask et al. |
| 2006/0244035 | A1 | 11/2006 | Bojarczuk, Jr. et al. |
| 2007/0001241 | A1 * | 1/2007 | Lim et al. ................. 257/410 |

* cited by examiner

*Primary Examiner*—Bradley K Smith
*Assistant Examiner*—Marvin Payen
(74) *Attorney, Agent, or Firm*—Scully, Scott, Murphy & Presser, P.C.; Louis J. Percello, Esq.

(57) ABSTRACT

An advanced method of patterning a gate stack including a high-k gate dielectric that is capped with a high-k gate dielectric capping layer such as, for example, a rare earth metal (or rare earth like)-containing layer is provided. In particular, the present invention provides a method in which a combination of wet and dry etching is used in patterning such gate stacks which substantially reduces the amount of remnant high-k gate dielectric capping material remaining on the surface of a semiconductor substrate to a value that is less than $10^{10}$ atoms/cm$^2$, preferably less than about $10^9$ atoms/cm$^2$.

31 Claims, 4 Drawing Sheets

ADVANCED HIGH-K GATE STACK PATTERNING AND STRUCTURE CONTAINING A PATTERNED HIGH-K GATE STACK

FIELD OF THE INVENTION

The present invention generally relates to a method of fabricating a semiconductor structure, and to the resultant semiconductor structure that is fabricated by the inventive method. More particularly, the present invention relates to a method of patterning a high-k gate stack which includes the use of a combination of wet and dry etching techniques in which dry etching is used to convert an exposed portion of a high-k dielectric capping layer present in the gate stack to a soluble compound which can be substantially removed during wet etching. The present invention also relates to a semiconductor structure in which at least one patterned high-k gate stack is present on a semiconductor substrate.

BACKGROUND OF THE INVENTION

In standard silicon complementary metal oxide semiconductor (CMOS) technology, n-type field effect transistors use an As (or other donor) doped n-type polysilicon layer as a gate electrode that is deposited on top of a silicon dioxide or silicon oxynitride gate dielectric layer. The gate voltage is applied through this polysilicon layer to create an inversion channel in the semiconductor substrate underneath the gate dielectric layer.

In future technology, silicon dioxide or silicon oxynitride dielectrics will be replaced with a gate material that has a higher dielectric constant. These materials are known as "high-k" materials with the term "high-k" denoting an insulating material whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Silicon metal oxide semiconductor field effect transistors (MOSFETs) fabricated with a hafnium-based dielectric as the gate dielectric suffer from a non-ideal threshold voltage when n-MOSFETs are fabricated. This is a general problem, and in particular, when the MOSFET consists of $HfO_2$ as the dielectric and TiN/polySi as the gate stack, the threshold voltage is in the 0.05 to 0.3 V range typically after standard thermal treatments. Ideally, the threshold voltage should be around −0.2 to −0.05 V or so.

U.S. patent application Ser. No. 11/118,521 filed Apr. 29, 2005 and entitled "Stabilization of Flatband Voltages and Threshold Voltages in Hafnium Oxide Based Silicon Transistors for CMOS" provides a solution to the above problem by incorporating a rare earth metal (or rare earth-like)-containing layer into the gate stack. In particular, the '521 application solves the above problem by disposing a rare earth metal (or rare earth like)-containing material on top of, or within a high-k gate dielectric. The presence of the rare earth metal (or rare earth-like)-containing material in the high-k gate stack stabilizes the flatband voltage and threshold voltage of the Si-containing conductor.

Despite overcoming the above mentioned problems with respect to flatband voltage and threshold voltage stabilization, the patterning of the high-k gate dielectric capped with a rare earth metal (or rare earth-like)-containing layer by lithography and etching, particularly wet etching, allows for a very low post-patterning remnant of rare earth metal or rare earth like-containing element (on the order of about 10 atoms/$cm^2$ or greater) on the surface of the semiconductor substrate that adjoins the patterned gate stack.

The presence of the rare earth metal or rare earth like-containing element on the surface of the semiconductor substrate is problematic in that it results in metal gate etching and integration challenges.

For example, the prior art etching step used in patterning such gate stacks typically utilizes a wet etchant, which inherently undercuts the high-k gate dielectric due to the anisotropic nature of wet etching. That is, conventional wet etching of a gate stack including a high-k gate dielectric typically damages the high-k gate dielectric. In some instances, the prior art wet etching process damages the integrity of the gate conductor as well. Also, prior art etching of gate stacks including a high-k gate dielectric and a rare earth metal (or rare earth-like)-containing capping layer may result in recessing of the semiconductor substrate which lies at the footprint of the now patterned gate stack.

In addition to the above, the remnant of rare earth metal or rare earth-like-containing element that remains on the surface of the semiconductor substrate can negatively impact the ion implantation of source/drain extension and diffusion regions into the substrate.

In view of the above, there is a need for providing a new and improved method for patterning gate stacks including a high-k gate dielectric and a rare earth metal (or rare earth like)-containing layer which reduces the amount of remnant rare earth metal or rare earth like-containing element on the surface of a semiconductor substrate to levels that are acceptable in current complementary metal oxide semiconductor (CMOS) fabrication.

SUMMARY OF THE INVENTION

The present invention provides a method which solves the above mentioned problems of patterning gate stacks including a high-k gate dielectric that is capped with a high-k gate dielectric capping layer such as, for example, a rare earth metal (or rare earth like)-containing material. In particular, the present invention provides a method in which a combination of wet and dry etching is used in patterning such gate stacks which substantially reduces the amount of remnant high-k gate dielectric capping material remaining on the surface of a semiconductor substrate to a value that is less than $10^{10}$ atoms/$cm^2$, preferably less than about $10^9$ atoms/$cm^2$.

More particularly, the inventive method uses a dry etching process which converts an element of the high-k gate dielectric capping layer to a soluble compound (e.g., salt or hydroxide) which can then be removed by wet etching.

It is noted that the above mentioned problems are not just limited to a rare earth metal (or rare earth like)-containing material instead it is applicable to all high-k gate dielectric capping layers that include an element that is capable of forming a soluble compound (hydroxide or salt). In general terms, the high-k gate dielectric capping layer includes an element from Group 2 (e.g., IIA), 3 (e.g., IIIB) and/or 13 (e.g., IIIA) of the Periodic Table of Elements. The Group 3 elements include rare earth metals and rare earth like metals.

High-k gate dielectric capping layers that include an element from Groups 2 or 3 of the Periodic Table of Elements are typically used in forming n-FETs, while high-k gate dielectric capping layers that include an element from Group 13 of the Periodic Table of Elements are typically employed in forming p-FETs.

In general terms, the method of the present invention comprises:

providing a gate stack including, from bottom to top, a high-k gate dielectric, a high-k gate dielectric capping layer which includes at least one element select from Group 2, 3, and 13 of the Periodic Table of Elements and a Si-containing conductor on a surface of a semiconductor substrate; and patterning said gate stack to form at least one patterned gate stack on said surface of said semiconductor substrate utilizing dry etching followed by wet etching, wherein said dry etching converts the at least one element to a soluble compound which is subsequently removed by said wet etching.

In one embodiment of the present invention, the dry etching process is used to remove a portion of the Si-containing conductor stopping on the high-k gate dielectric capping layer. In such an embodiment, the conversion of the at least one element of the high-k gate dielectric capping layer to a soluble compound is performed prior to etching of the high-k gate dielectric; the soluble compound forms during exposure to the dry etching chemistry. Wet etching is then used to remove the soluble compound thus formed as well as the underlying portion of the high-k gate dielectric.

In another embodiment, the dry etching process is used to remove portions of the Si-containing conductor, the high-k gate dielectric capping layer, and the high-k gate dielectric, stopping atop the surface of the semiconductor substrate. Wet etching is then used to remove the soluble compounds post etching of the high-k gate dielectric.

In any of the embodiments mentioned above, the high-k gate dielectric capping layer may be a surface layer that is present in an upper region of the high-k gate dielectric, a separate material layer of the gate stack, or it may be combined with an electrically conductive capping layer. In embodiments in which the high-k gate dielectric capping layer is not combined with an electrically conductive capping layer, a separate electrically conductive capping layer is typically present between the high-k gate dielectric capping layer and the Si-containing conductor.

The dry etching employed in the present invention includes a Cl-containing plasma, a $H_2O$ plasma or a reducing plasma such as, for example, $N_2$, $N_2/H_2$ and/or $NH_3$. Any combination of these plasmas may also be used. The Cl-containing plasma is used to form a chloride salt of the soluble element of the high-k gate dielectric capping layer. The $H_2O$ plasma forms a hydroxide or an oxyhydroxide of the soluble element of the high-k gate dielectric capping layer. The reducing plasmas reduce the oxides of the capping films to their corresponding elemental form which is more amendable to conversion to a soluble compound.

The wet etching employed in the present invention comprises any polar solvent that is capable of removing the soluble compound that forms. Examples of suitable polar solvents include $H_2O$, deionized $H_2O$, $H_2O_2$, water dilute with mineral acids such as DHF and other like polar solvents.

The combined etching steps may be performed in a single tool, or multiple tools may be used to perform the combination of dry etching and wet etching.

The patterning of the aforementioned gate stack utilizing a combination of dry etching and wet etching as described above results in the formation of a semiconductor structure which includes at least one patterned gate stack located on a surface of the semiconductor substrate. The combined etching steps provide a structure in which only trace levels (less than $10^{10}$ atoms/cm$^2$) of remnant high-k gate dielectric capping material remains on the surface of the semiconductor substrate.

In general terms, the present invention provides a semiconductor structure including:

at least one patterned gate stack located on a surface of a semiconductor substrate, wherein said at least one patterned gate stack includes, from bottom to top, a high-k gate dielectric, a high-k gate dielectric capping layer, and a Si-containing conductor, wherein said surface of said semiconductor substrate at the footprint of said at least one patterned gate stack contains less than $10^{10}$ atoms/cm$^2$ of remnant high-k gate dielectric capping material.

As stated above, the high-k gate dielectric capping layer may be a surface layer that is present in an upper region of the high-k gate dielectric, a separate material layer of the gate stack, or it may be combined with an electrically conductive capping layer. In embodiments in which the high-k gate dielectric capping layer is not combined with an electrically conductive capping layer, a separate electrically conductive capping layer is typically present between the high-k gate dielectric capping layer and the Si-containing conductor.

DETAILED DESCRIPTION OF THE INVENTION

The present invention, which provides an advanced method of patterning gate stacks that include at least a high-k gate dielectric and a high-k gate dielectric capping layer as well as the resultant structure formed by the inventive method, will now be described in greater detail by referring to the following discussion and drawings that accompany the present application. The drawings of the present invention, which are referred to in the present application, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a method of patterning a high-k gate stack which includes the use of a combination of wet and dry etching techniques in which dry etching is used to convert an exposed portion of the high-k dielectric capping layer present in the gate stack to a water soluble compound which can be substantially removed during wet etching. The present invention also relates to a semiconductor structure in which at least one patterned high-k gate stack is present on a semiconductor substrate.

Reference is first made to FIGS. 1-6 which are pictorial representations (through cross sectional views) depicting the basic processing steps of the present invention which are used in patterning a gate stack including a high-k gate dielectric and a high-k gate dielectric capping layer.

Figure 1:
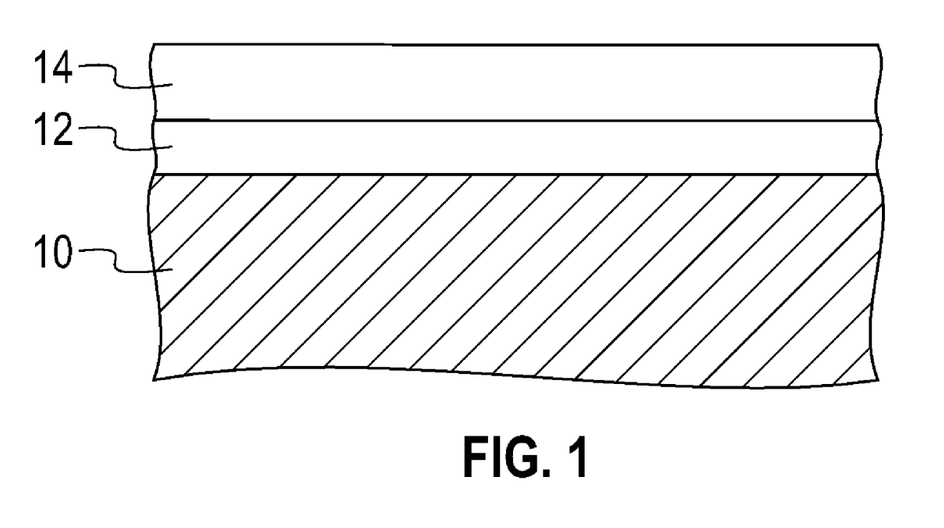
FIGS. 1-6 are pictorial representations (through cross sectional views) depicting the basic processing steps employed in the present invention.

FIG. 1 shows an initial structure that is formed in the present invention that includes a semiconductor substrate 10, an optional chemox layer 12 on a surface of the semiconductor substrate 10 and a high-k gate dielectric 14 that is located on the optional chemox layer 12. When the chemox layer 12 is not present, the high-k gate dielectric dielectric 14 is located directly on a surface of the semiconductor substrate 10.

The semiconductor substrate 10 of the structure shown in FIG. 1 comprises any semiconducting material including, but not limited to: Si, Ge, SiGe, SiC, SiGeC, Ge, GaAs, GaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or germanium-on-insulator (GOI). In some embodiments of the present invention, it is preferred that the semiconductor substrate 10 be composed of a Si-containing semiconductor material, i.e., a semiconductor material that includes silicon.

The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring transistor regions, typically required when the neighboring transistors have opposite conductivities, i.e., nFETs and pFETs. The neighboring transistor regions can have the same conductivity (i.e., both n- or p-type), or alternatively they can have different conductivities (i.e., one n-type and the other p-type).

After processing the semiconductor substrate 10, a chemox layer 12 is optionally formed on the surface of the semiconductor substrate 10. The optional chemox layer 12 is formed utilizing a conventional growing technique that is well known to those skilled in the art including, for example, oxidation or oxynitridation. The chemox layer 12 is comprised of silicon oxide, silicon oxynitride or a nitrided silicon oxide. The thickness of the chemox layer 12 is typically from about 0.5 to about 1.2 nm, with a thickness from about 0.8 to about 1 nm being more typical.

In accordance with an embodiment of the present invention, the chemox layer 12 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C.

Next, a high-k gate dielectric 14 is formed on the surface of the chemox layer 12, if present, or directly on the surface of the semiconductor substrate 10, if the optional chemox layer 12 is not present, by a deposition process such as, for example, chemical vapor deposition (CVD), plasma-assisted CVD, physical vapor deposition (PVP), metalorganic chemical vapor deposition (MOCVD), atomic layer deposition (ALD), evaporation, reactive sputtering, chemical solution deposition and other like deposition processes. The high-k gate dielectric 14 may also be formed utilizing any combination of the above processes.

The term "high-k" is used throughout the present application to denote a dielectric material, e.g., oxide, nitride or oxynitride, whose dielectric constant (relative to vacuum) is greater than that of silicon dioxide; i.e., a dielectric constant greater than 4.0. Typically, the high-k gate dielectric 14 has a dielectric constant of about 7.0 or greater. Examples of suitable high-k gate dielectrics 14 that can be employed in the present invention include nitrided silicon dioxide, silicon nitride, silicon oxynitride, $TiO_2$, $Al_2O_3$, Zr-based dielectrics, Hf-based dielectrics, $Ta_2O_5$, $La_2O_3$, perovskite-type oxides and other like dielectric materials. Multilayers of these dielectric materials may also be employed in forming the high-k gate dielectric 14. In some embodiments of the present invention, Hf-based dielectrics or Zr-based dielectrics are preferred.

The term 'Hf-based dielectric' denotes hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$. Typically, the Hf-based dielectric is hafnium oxide or hafnium silicate. The Hf-based dielectric is a "high-k" material whose dielectric constant is greater than about 10.0.

The term 'Zr based dielectric' denotes zirconium oxide ($ZrO_2$), zirconium silicate ($ZrSiO_x$), zirconium silicon oxynitride (ZrSiON) or multilayers thereof. Typically, the Zr-based dielectric is zirconium oxide.

The physical thickness of the high-k gate dielectric 14 may vary, but typically, the gate dielectric 14 has a thickness from about 0.5 to about 10 nm, with a thickness from about 0.5 to about 3 nm being more typical.

In one embodiment of the present invention, the high-k gate dielectric 14 is hafnium oxide that is formed by MOCVD) were a flow rate of about 70 to about 90 mgm of hafnium-tetrabutoxide (a Hf-precursor) and a flow rate of $O_2$ of about 250 to about 350 sccm are used. The deposition of Hf oxide occurs using a chamber pressure between 0.3 and 0.5 Torr and a substrate temperature of between 400° and 500° C.

In another embodiment of the present invention, the gate dielectric 14 is hafnium silicate which is formed by MOCVD using the following conditions (i) a flow rate of the precursor Hf-tetrabutoxide of between 70 and 90 mg/m, a flow rate of $O_2$ between 25 and 100 seem, and a flow rate of $SiH_4$ between 20 and 60 seem; (ii) a chamber pressure between 0.3 and 0.5 Torr, and (iii) a substrate temperature between 400° and 500° C.

Figure 2:
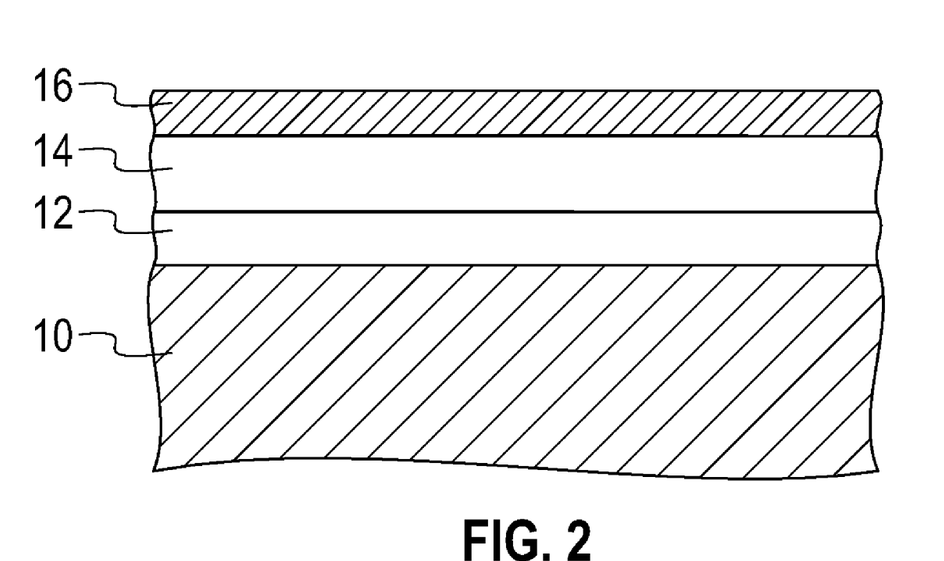

Once the structure shown in FIG. 1 is formed (with or without the optional chemox layer 12), a high-k gate dielectric capping layer 16 is then formed providing the structure shown in FIG. 2. The high-k gate dielectric capping layer 16 comprises any oxide or nitride-containing compound that includes an element that has a soluble salt or hydroxide, including an oxyhydroxide.

Typically, the high-k gate dielectric capping layer 16 comprises at least one element from Group 2 (e.g., IIA), 3 (e.g., IIIA) and 13 (e.g., IIIB) of the Periodic Table of Elements. Examples of Group 2 elements that can be used in the present invention include Be, Mg, Ca, Sr and/or Ba. Examples of Group 13 elements that can be used in the present invention include B, Al, Ge, and/or In. Examples of Group 3 elements include, for example, Se, Y, La, Ce, Pr, Nd, Pm, Sm, Eu, Ca, Tb, Dy, Ho, Er, Tm, Yb, Lu or mixtures thereof. Preferably, the high-k gate dielectric capping layer 16 is a rare earth metal-containing layer that comprises an oxide of La, Ce, Y, Sm, Er, and/or Tb, with $La_2O_3$ or LaN being most preferred.

The high-k dielectric capping layer 16 is formed utilizing a conventional deposition process including, for example, evaporation, molecular beam deposition, MOCVD, ALD, PVP and other like deposition processes.

In one embodiment of the present invention, the high-k gate dielectric capping layer 16 is formed by placing the structure shown in FIG. 1 into the load-lock of a molecular beam deposition chamber, followed by pumping this chamber down to the range of $10^{-5}$ to $10^{-8}$ Torr. After these steps, the structure is inserted, without breaking vacuum into the growth chamber where the high-k gate dielectric capping layer 16, e.g., a rare earth metal-containing layer such as La oxide, is deposited by directing atomic/molecular beams of the one of the above mentioned elements and oxygen or nitrogen onto the structure's surface. Specifically, because of the low pressure of the chamber, the released atomic/molecular species are beam like and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1 \times 10^{-5}$ to $8 \times 10^{-5}$ Torr, and the high-k gate dielectric capping layer 16 growth rate can be in the range from 0.1 to 2 nm per minute, with a range from 0.5 to 1.5 nm being more typical.

The high-k gate dielectric capping layer 16 typically has a thickness from about 0.1 nm to about 3.0 nm, with a thickness from about 0.3 nm to about 1.6 nm being more typical. It is noted that the high-k gate dielectric capping layer 16 may be a separate layer itself or it can be a surface layer located with an upper region of the high-k gate dielectric 14. The latter can be formed by incorporating at least of the above mentioned elements of the high-k gate dielectric capping layer into the gate dielectric layer by ion implantation, gas phase doping, immersion doping and/or diffusion.

Figure 3:
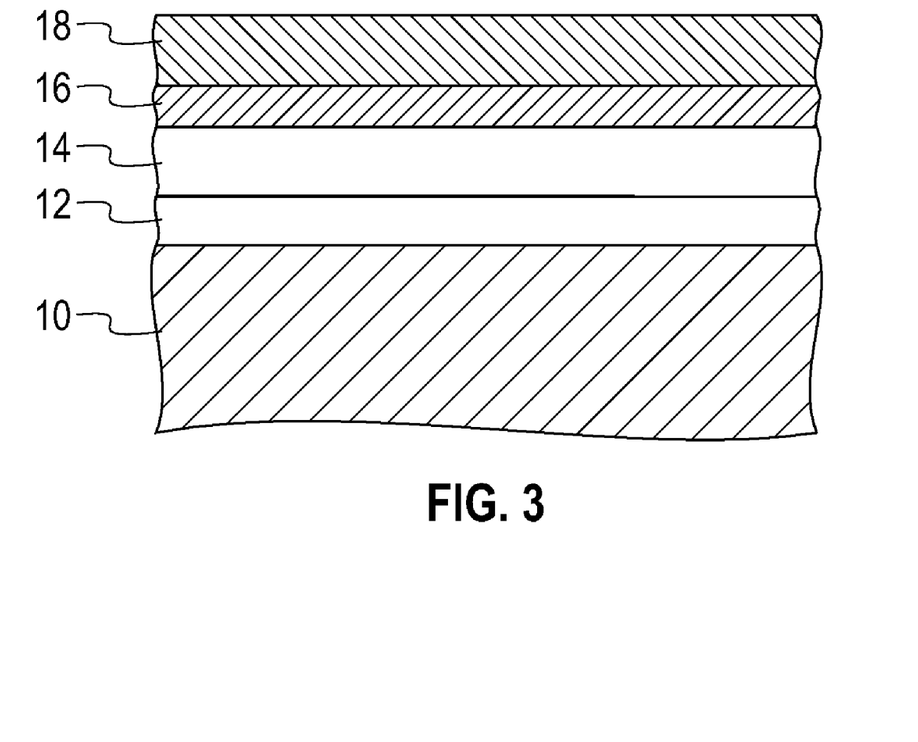

Next, and as shown in FIG. 3, an electrically conducting capping layer 18 is formed on the surface of the high-k gate dielectric capping layer 16 utilizing a conventional deposition process. Examples of conventional depositions that can be used in forming the electrically conductive capping layer 18 include CVD, PVD, ALD, sputtering or evaporation. The electrically conductive capping layer 18 is formed on the surface of the high-k gate dielectric capping layer 16 utilizing a conventional deposition process in which the vacuum between depositions may or may not be broken.

The electrically conductive capping layer 18 comprises a metallic material and/or a semimetallic material that is capable of conducting electrons. Specifically, the capping layer 18 is a metallic capping layer such as a metal nitride or a metal silicon nitride. The electrically conductive capping layer 18 provides the functions of (a) protecting the high-k gate dielectric capping layer from the ambient, (b) acts a diffusion barrier to ambient oxygen, and (c) prevents reaction of the high-k gate dielectric capping layer with a Si-containing conductor. In the embodiment when the capping layer includes a metal, the metal component of the capping layer 18 may comprise a metal from Group 4 (e.g., IVB) or 5 (e.g., VB) of the Periodic Table of Elements (using CA nomenclature. Hence, the electrically conductive capping layer 18 may include Ti, Zr, Hf, V, Nb or Ta, with Ti or Ta being highly preferred. By way of example, the electrically conductive capping layer 18 preferably comprises TiN or TaN.

In addition to the aforementioned electrically conductive capping layer materials, the present invention also includes a ternary alloy of Ti—La—N, a ternary alloy of Ta—La—N or a stack of a ternary alloy of Ti—La—N or Ta—La—N that is mixed with $La_2O_3$ or another one of the above mentioned materials used for the high-k gate dielectric capping layer. If the later is used, it may be possible to replace the separate high-k gate dielectric capping layer and the electrically conductive capping layer, with a single layer including both components.

For example and in yet another embodiment of the present invention, a material stack including an optional chemox layer, a high-k gate dielectric, a metal nitride layer including at least one rare earth metal or rare earth-like material, and polySi as the Si-containing gate conductor, wherein said metal nitride layer is used as both said dielectric capping layer and said electrically conducting capping layer is provided.

The physical thickness of the electrically conductive capping layer 18 may vary, but typically, the electrically conductive capping layer 18 has a thickness from about 0.5 to about 200 nm, with a thickness from about 5 to about 80 nm being more typical.

In one embodiment of the present invention, the electrically conductive capping layer 18 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

Following the formation of the electrically conductive capping layer 18 as shown in FIG. 3, a Si-containing conductor 20 is formed atop the electrically conductive capping layer

Figure 4:
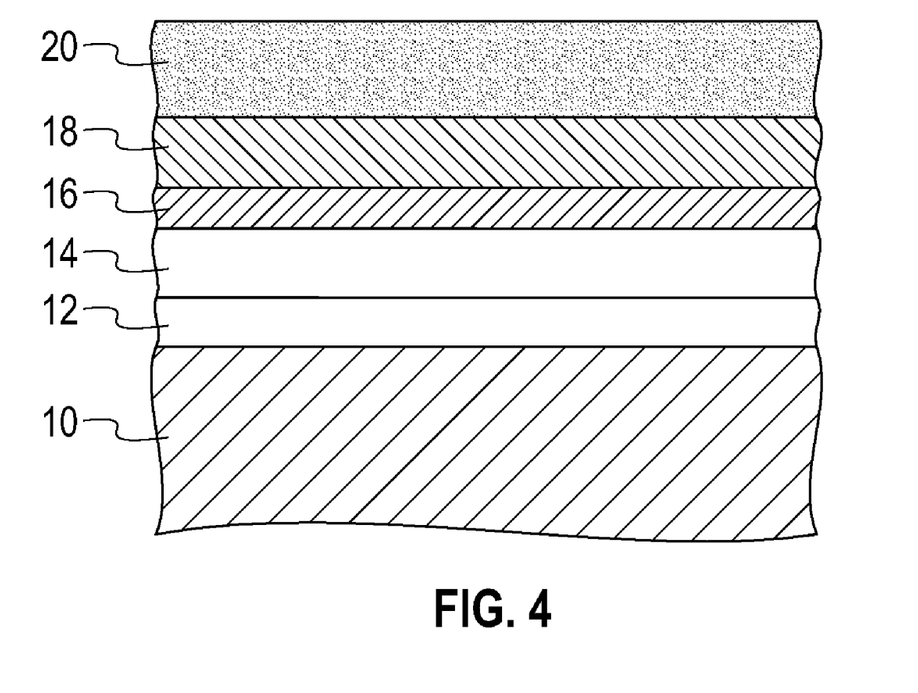

18. The resultant structure including the Si-containing conductor 20 is shown in FIG. 4. Specifically, a blanket layer of a Si-containing material is formed on the electrically conductive capping layer 18 utilizing a known deposition process such as, for example, physical vapor deposition, CVD or evaporation.

The Si-containing material used in forming the conductor 20 includes Si or a SiGe alloy layer in either single crystal, polycrystalline or amorphous form. Combinations of the aforementioned Si-containing materials are also contemplated herein. The blanket layer of Si-containing material 20 may be doped or undoped. If doped, an in-situ doping deposition process may be employed in forming the same. Alternatively, a doped Si-containing layer can be formed by deposition, ion implantation and annealing. The ion implantation and annealing can occur prior to or after a subsequent etching step that patterns the material stack. The doping of the Si-containing layer will shift the work function of the gate conductor formed. Illustrative examples of dopant ions for nMOSFETs include elements from Group VA of the Periodic Table of Elements (Group IIIA elements can be used when pMOSFETs are formed).

The thickness, i.e., height, of the Si-containing layer 20 deposited at this point of the present invention may vary depending on the deposition process employed. Typically, the Si-containing conductor 20 has a vertical thickness from about 20 to about 180 nm, with a thickness from about 40 to about 150 nm being more typical.

The gate stack structure shown in FIG. 4 is then patterned by lithography and etching, wherein the etching process comprises a combination of dry etching and wet etching. The use of the combination of wet and dry etching provides a patterned gate stack wherein the amount of remnant high-k gate dielectric capping material remaining on the surface of the semiconductor substrate is reduced to a value that is less than $10^{10}$ atoms/cm$^2$, preferably less than about $10^9$ atoms/cm$^2$.

As stated above, the inventive method uses a dry etching process which converts an element of the high-k gate dielectric capping layer which is exposed to the dry etching chemistry to a water soluble compound (e.g., salt or hydroxide) which can then be removed by wet etching. This patterning process used in the present application is now described in greater detail.

The lithographic step employed in the present invention comprises any conventional lithographic patterning process well known to those skilled in the art. For example, the lithographic step includes forming a photoresist or a material stack of a hard mask and a photoresist atop the Si-containing conductor 20. If present, the hard mask comprises an oxide, such as silicon dioxide, or a nitride, such as silicon nitride, while the photoresist comprises any conventional resist material (organic, inorganic or hybrid). When a hard mask is present, the hard mask material is formed by any conventional deposition process including, for example, CVD, PECVD, evaporation, chemical solution deposition and the like. Alternatively, the hard mask can be formed by a thermal process such as, for example, oxidation or nitridation. The photoresist is formed by any conventional deposition process such as, for example, CVD, PECVD, evaporation or spin-on coating.

After forming at least the photoresist on the surface of the Si-containing conductor 20, the photoresist is exposed to a desired pattern of radiation (i.e., a gate conductor pattern) and developed utilizing a conventional resist developer.

Figure 5A:
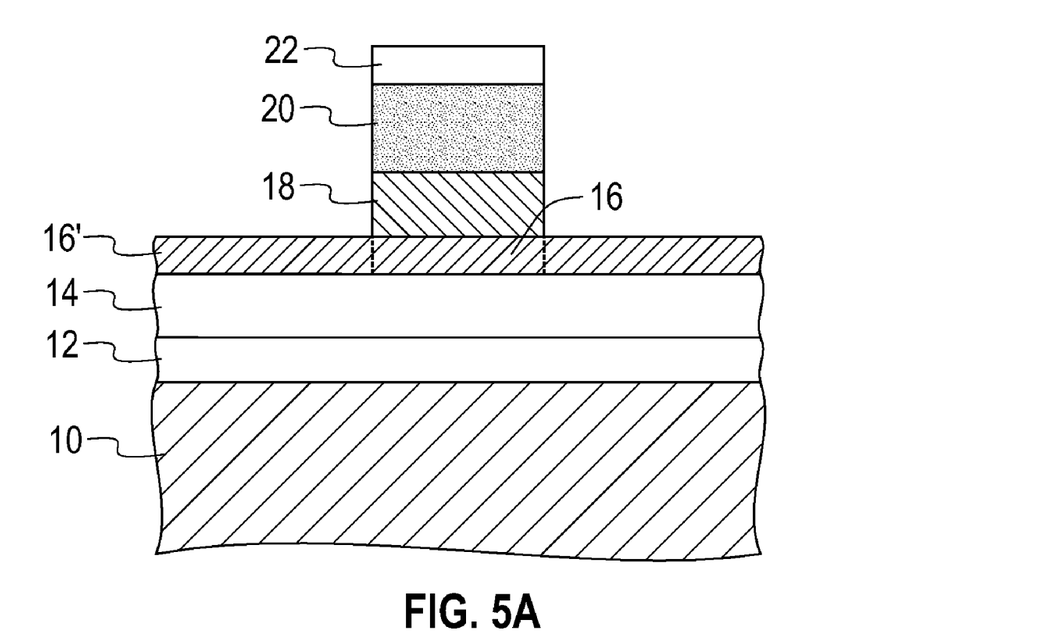
Figure 5B:
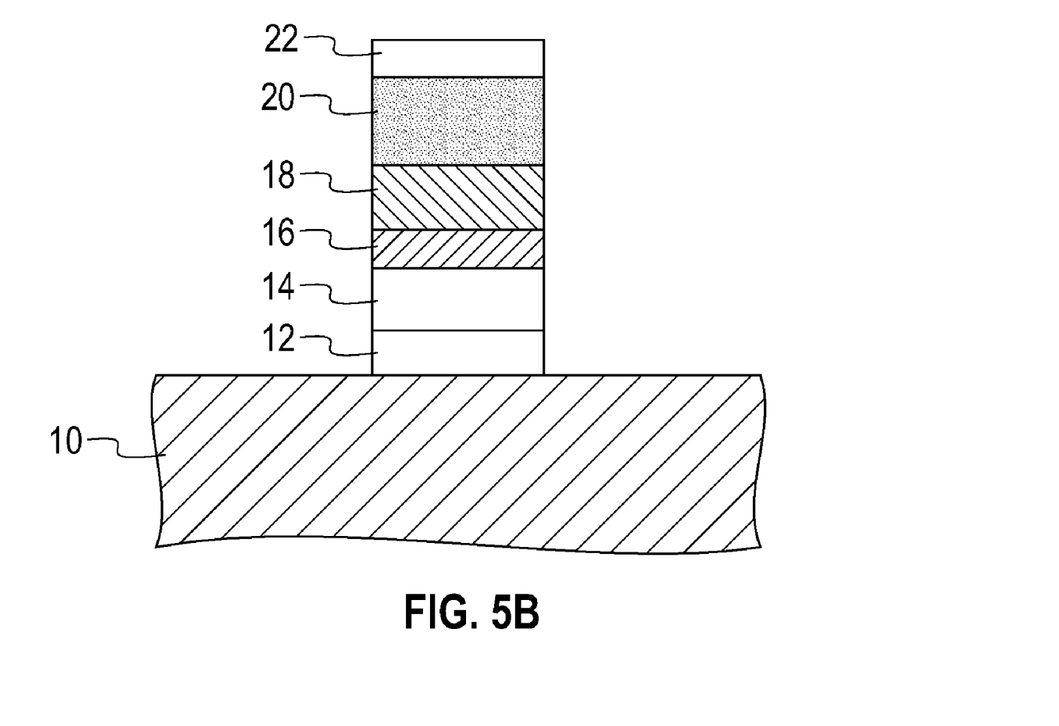

A combined etching step is then used to transfer the pattern from at least the patterned resist to the gate stack structure shown in FIG. 4. In embodiments when a hard mask is present, the patterned resist is typically, but not necessarily always, removed after transfer of the pattern into the hard mask. FIGS. 5A and 5B shows two different embodiments of the present invention. In both embodiments, a patterned hard mask 22 is used to transfer the pattern into the gate stack shown in FIG. 4. The patterned hard mask 22 can remain in the final structure or it can be removed utilizing a conventional stripping process that selectively removes the patterned hard mask 22 from the structure.

In one embodiment (prior to etching the gate dielectric) of the present invention, such as shown in FIG. 5A, the dry etching process is used to remove a portion of the Si-containing conductor 20 as well as an underlying portion of electrically conductive capping layer 18, stopping on the high-k gate dielectric capping layer 16. In such an embodiment, a portion of dielectric capping layer that is exposed to the dry etching chemistry will be converted into a soluble compound. Wet etching is then used to remove the soluble compound thus formed as well as the underlying portion of the high-k gate dielectric 12 and, if present, a portion of the chemox layer 12. In FIG. 5A, reference numeral 16' denotes the soluble compound formed.

In another embodiment such as shown in FIG. 5B, the dry etching process is used to remove portions of the Si-containing conductor 20, the underlying electrically conductive capping layer 18, the high-k gate dielectric capping layer 16, the high-k gate dielectric 14 and, if present, the chemox layer 12, stopping on the surface of the semiconductor substrate. Some residual, i.e., remnant, material of the capping layer 16 may remain on the surface of the substrate 10 at the footprint of the now patterned gate stack. Wet etching is then used to remove the soluble compounds post etching of the high-k gate dielectric.

The dry etching employed in the present invention includes a chlorine (Cl)-containing plasma such as for example, $Cl_2$, $BCl_3$ or mixtures thereof with other rare gases, $O_2$ or $N_2$, a $H_2O$ plasma or a reducing plasma such as, for example, $N_2$, a $N_2/H_2$ plasma and/or $NH_3$. Any combination of these plasmas may also be used. The chlorine-containing plasma such as a $BCl_3$ plasma is used to form a chloride salt of the soluble element of the high-k gate dielectric capping layer. The $H_2O$ plasma forms a hydroxide or an oxyhydroxide of the soluble element of the high-k gate capping layer. The reducing plasma is employed to reduce the oxides of the capping films to their corresponding elemental form since such forms are more amenable to conversion to a soluble compound.

When a Cl-containing plasma is employed, the following conditions can be used: 5000-1000 W/500-1000 sccm of Cl-containing material with a wafer temperature from about 40° to about 400° C. in a microwave discharge.

When a $H_2O$ plasma is employed, the following conditions can be used: 5000-1000 W/500-1000 sccm of water vapor with a wafer temperature from about 40° to about 400° C. in a microwave discharge.

When a reducing plasma is employed, the following conditions can be employed. 5000-1000 W/500-1000 sccm of reducing composition with a wafer temperature from about 40° to about 400° C. in a microwave discharge.

It should be emphasized that the conditions mentioned and described above, for the various plasma chemistries are typical and that the present invention is not limited to using the same. Instead, any conventional plasma conditions can be used so long as they form the soluble compound described above.

Figure 6:
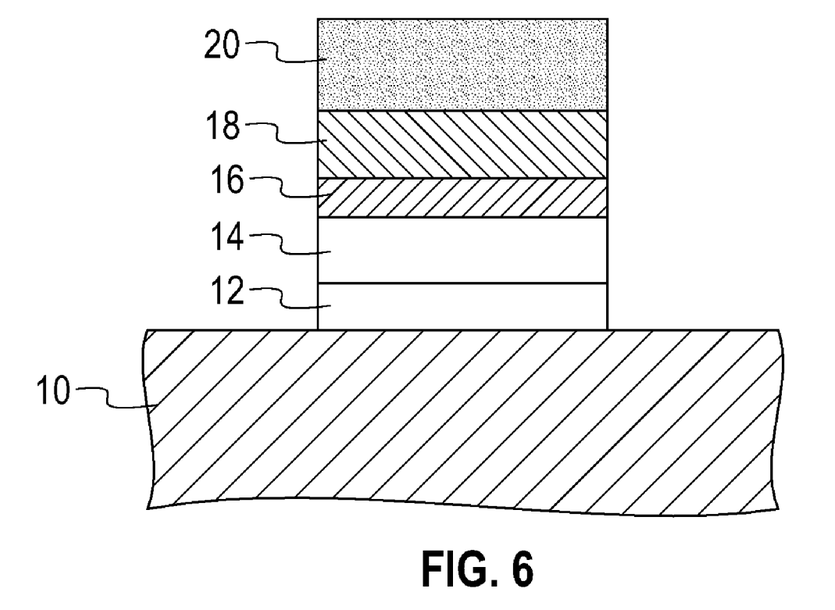

The wet etching employed in the present invention comprises any polar solvent that is capable of removing the soluble compound that forms. Examples of suitable polar solvents include $H_2O$, deionized $H_2O$, $H_2O_2$, water dilute with mineral acids such as DHF and other like polar solvents. Preferably, dilute water is used. The wet etching is performed at a temperature from about 0° to about 200° C. The structure that is formed after wet etching of the structure shown in either FIG. 5A or FIG. 5B is shown in FIG. 6. Note that the patterned hard mask 22 can be removed from the structure at this point of the present invention, or it can remain on the structure during further processing. FIG. 6 shows the absence of the patterned hard mask 22.

The method of the present invention can be used in forming a MOSCAP and/or a MOSFET on a surface of the semiconductor structure utilizing standard processing techniques coupled with the inventive patterning process. A typical MOSCAP is similar to the structure shown in FIG. 6. The formation of the MOSCAP includes forming a thermal sacrificial oxide (not shown) on the surface of the semiconductor substrate. Using lithography, the active areas of the capacitor structure are opened in the field oxide by etching. Following the removal of the oxide, the material stack as shown in FIG. 4 is formed as described above. Specifically, the material stack is provided, patterned by lithography and etching as described above, and then dopants are introduced into the Si-containing conductor 20. The dopants are typically P (implant dose of 5E15 ions/cm$^2$ using an implant energy of 12 keV). The dopants are activated using an activation anneal that is performed at 950° C. to 1000° C. for about 5 seconds. In some cases, a forming gas anneal (5-10% hydrogen) can follow which is performed between 500° to 550° C. for chemox layer/semiconductor substrate interface state passivation.

Figure 7:
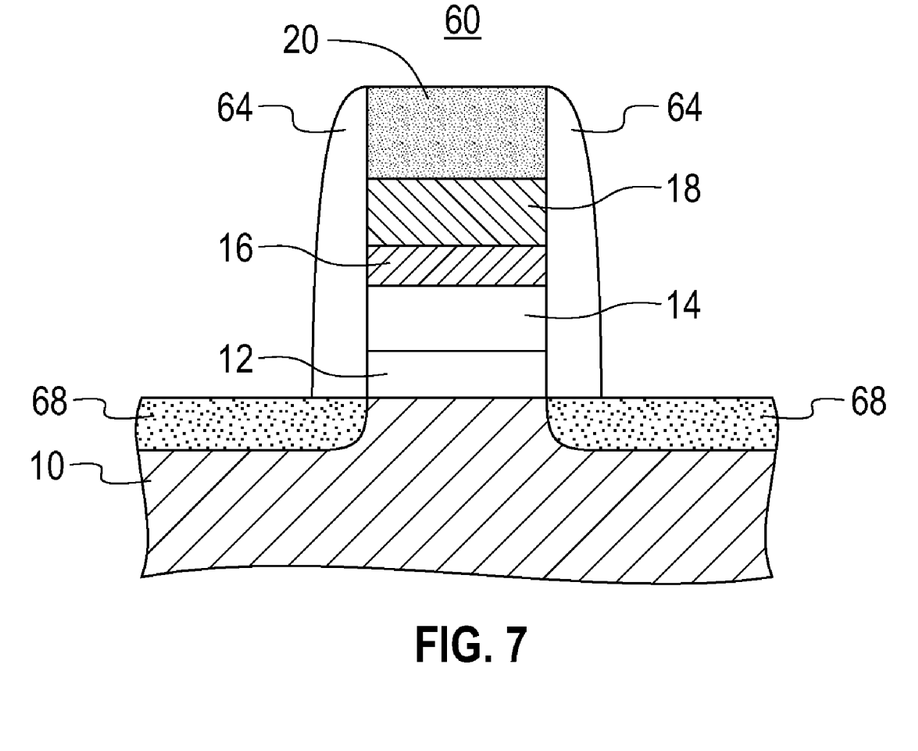
FIG. 7 is a pictorial representation (through a cross sectional view) illustrating a MOSFET that can be formed in the present invention.

A typical MOSFET 60 that can be formed in the present invention is shown in FIG. 7. The MOSFET formation includes first forming isolation regions within the substrate 10 as described above. Similar to the MOSCAP and after removing the sacrificial oxide, a material stack as described above is formed. Following patterning of the material stack, at least one spacer 64 is typically, but not always, formed on exposed sidewalls of each patterned material stack. The at least one spacer 64 is comprised of an insulator such as an oxide, nitride, oxynitride and/or any combination thereof. The at least one spacer 64 is formed by deposition and etching.

The width of the at least one spacer 64 must be sufficiently wide such that the source and drain silicide contacts do not encroach underneath the edges of the patterned material stack. Typically, the source/drain silicide does not encroach underneath the edges of the patterned material stack when the at least one spacer 64 has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions 68 are then formed into the substrate. The source/drain diffusion regions 68 are formed utilizing ion implantation and an annealing step. The annealing step serves to activate the dopants that were implanted by the previous implant step. The conditions for the ion implantation and annealing are well known to those skilled in the art. The source/drain diffusion regions 68 may also include extension implant regions, which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 500° to 550° C. for chemox layer/semiconductor substrate interface state passivation.

Further CMOS processing such as formation of silicided contacts (source/drain and gate) as well as formation of BEOL (back-end-of-the-line) interconnect levels with metal interconnects can be formed utilizing processing steps that are well known to those skilled in the art While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of patterning a gate stack comprising:
providing an unpatterned gate stack including, from bottom to top, a high-k gate dielectric, a high-k gate dielectric capping layer which includes at least one element selected from Group 2, 3, and 13 of the Periodic Table of Elements, and a Si-containing conductor on a surface of a semiconductor substrate; and
patterning said unpatterned gate stack to form at least one patterned gate stack on said surface of said semiconductor substrate utilizing a dry etching process followed by a wet etching process, wherein said dry etching process patterns the Si-containing conductor, the high-k gate dielectric capping layer and the high-k gate dielectric, stops on a surface of said high-k gate dielectric capping layer, and converts the at least one element within said high-k gate dielectric capping layer to a soluble compound, wherein an underlying portion of said high-k gate dielectric is covered by said soluble compound and is not exposed after said dry etching process and before said wet etching process, said soluble compound having a different composition than said high-k gate dielectric, and said wet etching process subsequently removes the soluble compound and said underlying portion of said high-k gate dielectric from the surface of the substrate.

2. The method of claim 1 wherein said high-k gate dielectric capping layer is a surface layer of said high-k gate dielectric located at an upper region of said high-k gate dielectric.

3. The method of claim 1 wherein said high-k gate dielectric capping layer is combined with elements of an electrically conductive capping layer.

4. The method of claim 1 further comprising an electrically conductive capping layer located between said high-k gate dielectric capping layer and said Si-containing conductor.

5. The method of claim 1 wherein said high-k gate dielectric capping layer comprises at least one element selected from Groups 2 and 3 of the Periodic Table of Elements.

6. The method of claim 5 wherein said at least one element is selected from Group 3 of the Periodic Table of Elements and is one of Sc, Y, La, Ce, Pr, Nd, Pm, Sm, Eu, Ga, Tb, Dy, Ho, Er, Tm, Yb and Lu.

7. The method of claim 1 wherein the high-k gate dielectric capping layer is selected from $La_2O_3$ or LaN.

8. The method of claim 1 wherein said high-k gate dielectric is at least one of a Hf-based dielectric and a Zr-based dielectric.

9. The method of claim 1 wherein said dry etching process comprises plasma etching.

10. The method of claim 9 wherein said plasma etching includes at least one of a Cl-containing plasma, a $H_2O$ plasma, a $N_2$ plasma, a $N_2/H_2$ plasma and a $NH_3$ plasma.

11. The method of claim 1 wherein said wet etching process is performed in a polar solvent.

12. The method of claim 11 wherein said polar solvent is one of water, deionized water, $H_2O_2$, and water diluted with a mineral acid.

13. The method of claim 1 wherein said patterning by said dry etching process and said wet etching process provides less than $10^{10}$ atoms/cm$^2$ of remnant high-k gate dielectric capping material on the surface of said semiconductor substrate.

14. A method of patterning a gate stack comprising:
providing an unpatterned gate stack including, from bottom to top, a high-k gate dielectric, a high-k gate dielectric capping layer which includes at least one element selected from Group 2, 3, and 13 of the Periodic Table of Elements, and a Si-containing conductor on a surface of a semiconductor substrate;
patterning said Si-containing conductor of said unpatterned gate stack stopping on a surface of said high-k gate dielectric capping layer utilizing a dry etching process which converts an exposed portion of said high-k dielectric capping layer to a soluble compound, wherein an underlying portion of said high-k gate dielectric is covered by said soluble compound and is not exposed after said dry etching process and before said wet etching process, said soluble compound having a different composition than said high-k gate dielectric; and
removing said soluble compound by a wet etching process, wherein said wet etching process also removes said high-k gate dielectric.

15. The method of claim 14 wherein said high-k gate dielectric capping layer is a surface layer of said high-k gate dielectric located at an upper region of said high-k gate dielectric.

16. The method of claim 14 wherein said high-k gate dielectric capping layer is combined with elements of an electrically conductive capping layer.

17. The method of claim 14 further comprising an electrically conductive capping layer located between said high-k gate dielectric capping layer and said Si-containing conductor.

18. The method of claim 14 wherein said high-k gate dielectric capping layer comprises at least one element selected from Groups 2 and 3 of the Periodic Table of Elements.

19. The method of claim 14 wherein said dry etching process comprises plasma etching.

20. The method of claim 19 wherein said plasma etching includes at least one of a Cl-containing plasma, a $H_2O$ plasma, a $N_2$ plasma, a $N_2/H_2$ plasma and a $NH_3$ plasma.

21. The method of claim 14 wherein said wet etching process is performed in a polar solvent.

22. The method of claim 21 wherein said polar solvent is one of water, deionized water, $H_2O_2$, and water diluted with a mineral acid.

23. The method of claim 14 wherein said dry etching process and said wet etching process provide less than $10^{10}$ atoms/cm$^2$ of remnant high-k gate dielectric capping material on the surface of said semiconductor substrate.

24. A semiconductor structure comprising:
a high-k dielectric located on a surface of a semiconductor substrate;
at least one patterned gate stack located on a surface of said high-k dielectric, wherein said at least one patterned stack includes, from bottom to top, a patterned portion of a high-k gate dielectric capping layer which includes at least one element selected from Group 2, 3, and 13 of the Periodic Table of Elements, and a Si-containing conductor; and
a portion of a soluble compound including said at least one element, located on said surface of said high-k dielectric, and laterally contacting said patterned portion of said high-k gate dielectric capping layer, said soluble compound having a different composition than said high-k gate dielectric.

25. The semiconductor structure of claim 24 wherein said high-k gate dielectric capping layer is a surface layer of said high-k gate dielectric located at an upper region of said high-k gate dielectric.

26. The semiconductor structure of claim 24 wherein said high-k gate dielectric capping layer is combined with elements of an electrically conductive capping layer.

27. The semiconductor structure of claim 24 further comprising an electrically conductive capping layer located between said high-k gate dielectric capping layer and said Si-containing conductor.

28. The semiconductor structure of claim 24 wherein said at least one element is selected from Group 3 of the Periodic Table of Elements and is one of Sc, Y, La, Ce, Pr, Nd, Pm, Sm, Eu, Ga, Tb, Dy, Ho, Er, Tm, Yb and Lu.

29. The method of claim 1, wherein said high-k gate dielectric is at least one of a Hf-based dielectric and a Zr-based dielectric, and said high-k gate dielectric capping layer is selected from $La_2O_3$ or LaN.

30. The method of claim 14, wherein said high-k gate dielectric is at least one of a Hf-based dielectric and a Zr-based dielectric, and said high-k gate dielectric capping layer is selected from $La_2O_3$ or LaN.

31. The semiconductor structure of claim 24, wherein said high-k gate dielectric is at least one of a Hf-based dielectric and a Zr-based dielectric, and said high-k gate dielectric capping layer is selected from $La_2O_3$ or LaN.

* * * * *